United States Patent
Blandino et al.

(10) Patent No.: US 12,127,595 B2
(45) Date of Patent: Oct. 29, 2024

(54) AEROSOL PROVISION DEVICE

(71) Applicant: Nicoventures Trading Limited, London (GB)

(72) Inventors: Thomas Paul Blandino, Cottage Grove, WI (US); Ashley John Sayed, London (GB); Mitchel Thorsen, Madison, WI (US); Luke James Warren, London (GB)

(73) Assignee: NICOVENTURES TRADING LIMITED, London (GB)

( * ) Notice: Subject to any disclaimer, the term of this patent is extended or adjusted under 35 U.S.C. 154(b) by 518 days.

(21) Appl. No.: 17/593,135

(22) PCT Filed: Mar. 9, 2020

(86) PCT No.: PCT/EP2020/056245
§ 371 (c)(1),
(2) Date: Sep. 10, 2021

(87) PCT Pub. No.: WO2020/182753
PCT Pub. Date: Sep. 17, 2020

(65) Prior Publication Data
US 2022/0183369 A1    Jun. 16, 2022

Related U.S. Application Data

(60) Provisional application No. 62/816,258, filed on Mar. 11, 2019, provisional application No. 62/816,260, filed on Mar. 11, 2019.

(51) Int. Cl.
*A24F 40/57*       (2020.01)
*A24F 40/465*      (2020.01)
(Continued)

(52) U.S. Cl.
CPC ............ *A24F 40/465* (2020.01); *A24F 40/57* (2020.01); *H05B 6/105* (2013.01); *H05K 1/0278* (2013.01);
(Continued)

(58) Field of Classification Search
CPC ..... A24F 40/465; A24F 40/57; H05K 1/0278; H05K 1/189; H05K 2201/1003; H05K 2201/10189; H05B 6/105
(Continued)

(56) References Cited

U.S. PATENT DOCUMENTS 9,089,166 B1 * 7/2015 Scatterday ............. A24F 40/95
9,277,770 B2 * 3/2016 DePiano ................. A24F 40/46
(Continued)

FOREIGN PATENT DOCUMENTS

CN         2562378 Y       7/2003
CN       203555163 U       4/2014
(Continued)

OTHER PUBLICATIONS

International Preliminary Report on Patentability for Application No. PCT/EP2020/056245, mailed on Sep. 23, 2021, 11 pages.
(Continued)

*Primary Examiner* — Abdullah A Riyami
*Assistant Examiner* — Vladimir Imas
(74) *Attorney, Agent, or Firm* — Husch Blackwell

(57) ABSTRACT

Aerosol provision devices having printed circuit boards are described. One such aerosol provision device defines a longitudinal axis and comprises an electrical connector, a heater assembly configured to heat aerosol generating material received within the device and a printed circuit board (PCB). The PCB comprises a first portion arranged substantially parallel to the longitudinal axis and a second portion arranged substantially perpendicular to the longitudinal axis.
(Continued)

The heater assembly is electrically coupled to the first portion. The second portion is electrically coupled to the first portion and the electrical connector is electrically coupled to the second portion. Another such aerosol provision device comprises a first coil for heating a heater component and a PCB arranged adjacent to the first coil. The PCB comprises: a first through hole connected to a first end of the first coil; and a second through hole connected to a second end of the first coil.

14 Claims, 10 Drawing Sheets

(51) Int. Cl.
  *H05B 6/10* (2006.01)
  *H05K 1/02* (2006.01)
  *H05K 1/18* (2006.01)
(52) U.S. Cl.
  CPC ..... *H05K 1/189* (2013.01); *H05K 2201/1003* (2013.01); *H05K 2201/10189* (2013.01)
(58) Field of Classification Search
  USPC .......................................................... 131/329
  See application file for complete search history.

(56) References Cited

U.S. PATENT DOCUMENTS

| | | | |
|---|---|---|---|
| 9,302,825 B2 * | 4/2016 | Liu | B65D 43/163 |
| 9,609,893 B2 * | 4/2017 | Novak, III | A24F 40/40 |
| 9,668,522 B2 * | 6/2017 | Memari | A24F 40/50 |
| 9,769,878 B2 * | 9/2017 | Xiang | A24F 40/53 |
| 10,034,988 B2 * | 7/2018 | Wensley | A61M 15/06 |
| 10,070,667 B2 * | 9/2018 | Lord | H03K 17/9517 |
| 10,236,708 B2 * | 3/2019 | Schennum | B65D 43/163 |
| 10,244,793 B2 * | 4/2019 | Monsees | H05B 3/146 |
| 10,279,934 B2 * | 5/2019 | Christensen | B65B 3/18 |
| 10,285,444 B2 * | 5/2019 | Clemens | A24F 40/40 |
| 10,343,818 B2 * | 7/2019 | Murphy | B65D 43/16 |
| 10,405,582 B2 * | 9/2019 | Hatton | A24F 40/50 |
| 10,412,994 B2 * | 9/2019 | Schennum | A24F 40/95 |
| 10,433,584 B2 * | 10/2019 | Nettenstrom | A24F 40/95 |
| 10,595,561 B2 * | 3/2020 | DePiano | A24F 40/46 |
| 10,667,561 B2 * | 6/2020 | Verleur | A24F 40/42 |
| 10,701,972 B2 * | 7/2020 | Biel | A24F 40/44 |
| 10,701,975 B2 * | 7/2020 | Bowen | H02J 7/0044 |
| 10,709,173 B2 * | 7/2020 | Monsees | A24F 40/42 |
| 10,750,779 B2 * | 8/2020 | Schennum | A24F 40/90 |
| 10,931,130 B2 * | 2/2021 | Akao | A61M 11/042 |
| 10,945,457 B2 * | 3/2021 | Sur | A24F 40/46 |
| 11,134,722 B2 * | 10/2021 | Verleur | A24F 40/90 |
| 11,234,463 B2 * | 2/2022 | DePiano | F22B 1/282 |
| 11,425,936 B2 * | 8/2022 | Otiaba | A24F 40/51 |
| 11,432,589 B2 * | 9/2022 | Otiaba | A24F 40/46 |
| 11,458,265 B2 * | 10/2022 | Brammer | A24F 40/42 |
| 2003/0190837 A1 | 10/2003 | Wu | |
| 2014/0053858 A1 | 2/2014 | Liu | |
| 2014/0283825 A1 | 9/2014 | Buchberger | |
| 2015/0101622 A1 | 4/2015 | Liu | |
| 2015/0114409 A1 * | 4/2015 | Brammer | F24H 1/0018 |
| 2015/0282527 A1 * | 10/2015 | Henry, Jr. | G01F 1/28 |
| | | | 131/328 |
| 2015/0305409 A1 | 10/2015 | Verleur et al. | |
| 2015/0366267 A1 | 12/2015 | Liu | |
| 2016/0235122 A1 | 8/2016 | Krietzman | |
| 2016/0366942 A1 | 12/2016 | Liu | |
| 2017/0027228 A1 | 2/2017 | Rastogi | |
| 2018/0056016 A1 | 3/2018 | Qiu | |
| 2018/0360119 A1 | 12/2018 | Kuwa et al. | |
| 2018/0360120 A1 | 12/2018 | Huang et al. | |
| 2023/0285694 A1 * | 9/2023 | Buchberger | A61M 15/0091 |

FOREIGN PATENT DOCUMENTS

| | | |
|---|---|---|
| CN | 204560964 U | 8/2015 |
| CN | 106343611 A | 1/2017 |
| CN | 107536113 A | 1/2018 |
| CN | 206866628 U | 1/2018 |
| CN | 108308723 A | 7/2018 |
| CN | 109076650 A | 12/2018 |
| CN | 109315836 A | 2/2019 |
| EP | 1989946 A1 | 11/2008 |
| JP | 2014512207 A | 5/2014 |
| JP | 2015516809 A | 6/2015 |
| JP | 2017127300 A | 7/2017 |
| JP | 2017225357 A | 12/2017 |
| WO | WO-2015077645 A1 | 5/2015 |
| WO | 2017163052 A1 | 9/2017 |
| WO | 2018073376 A1 | 4/2018 |
| WO | 2019232086 A1 | 12/2019 |

OTHER PUBLICATIONS

International Search Report and Written Opinion for International Application No. PCT/EP2020/056245 mailed on Sep. 7, 2020, 19 pages.
"Decision of Refusal received for Japanese Patent Application No. 2021-554592 mailed on May 16, 2023", 6 pages (3 pages of English Translation and 3 pages of Official Copy).
"International Preliminary Report on Patentability received for PCT Patent Application No. PCT/EP2020/056243, mailed on Sep. 23, 2021", 8 pages.
"International Search Report and Written Opinion received for PCT Patent Application No. PCT/EP2020/056243, mailed on Jun. 2, 2020", 11 pages.
"Invitation to Pay Additional Fees received for PCT Patent Application No. PCT/EP2020/056245, mailed on May 29, 2020", 10 pages.
"Office Action received for Australian Patent Application No. 2020235043, mailed on Jun. 30, 2022", 4 pages.
"Office Action received for Chinese Patent Application No. 202080033336.1, mailed on Jun. 29, 2023", 7 pages (Official Copy Only).
"Office Action received for Russian Patent Application No. 2021126654, mailed on Jun. 8, 2022", 15 pages.
"Reasons for Refusal received for Japanese Patent Application No. 2021-554592, mailed on Jan. 10, 2023", 10 pages (5 pages of English Translation and 5 pages of Official Copy).

* cited by examiner

AEROSOL PROVISION DEVICE

PRIORITY CLAIM

The present application is a National Phase entry of PCT Application No. PCT/EP2020/056245, filed Mar. 9, 2020, which claims priority from U.S. Provisional Application No. 62/816,258, filed Mar. 11, 2019, and U.S. Provisional Application No. 62/816,260, filed Mar. 11, 2019, each of which are hereby fully incorporated by reference herein.

TECHNICAL FIELD

The present invention relates to an aerosol provision device and a printed circuit board for an aerosol provision device.

BACKGROUND

Smoking articles such as cigarettes, cigars and the like burn tobacco during use to create tobacco smoke. Attempts have been made to provide alternatives to these articles that burn tobacco by creating products that release compounds without burning. Examples of such products are heating devices which release compounds by heating, but not burning, the material. The material may be for example tobacco or other non-tobacco products, which may or may not contain nicotine.

SUMMARY

According to a first aspect of the present disclosure, there is provided an aerosol provision device defining a longitudinal axis, and comprising:
 an electrical connector;
 a heater assembly configured to heat aerosol generating material received within the device;
 a printed circuit board (PCB) comprising:
 a first portion arranged substantially parallel to the longitudinal axis; and
 a second portion arranged substantially perpendicular to the longitudinal axis;
 wherein:
 the heater assembly is electrically coupled to one of the first portion and the second portion;
 the second portion is electrically coupled to the first portion; and
 the electrical connector is electrically coupled to the other of the first portion and the second portion.

According to a second aspect of the present disclosure, there is provided a PCB for an aerosol provision device comprising:
 a first portion; and
 a second portion;
 wherein:
 the first portion is configured to be electrically coupled to one of a heater assembly and an electrical connector;
 the second portion is electrically coupled to the first portion; and
 the second portion is configured to be electrically coupled to the other of the heater assembly and the electrical connector.

According to a third aspect of the present disclosure, there is provided an aerosol provision device defining a longitudinal axis, and comprising:
 an electrical connector;
 a top surface arranged at one end of the device;
 a bottom surface arranged at another end of the device, wherein the bottom surface is spaced apart from the top surface along the longitudinal axis; and
 one or more side surfaces extending between the top and bottom surfaces, extending around the longitudinal axis, and delimiting an opening for access to the electrical connector.

According to a fourth aspect of the present disclosure, there is provided an aerosol provision device comprising an electrical connector. The electrical connector is positioned at a side of the aerosol position device.

According to a fifth aspect of the present disclosure, there is provided an aerosol provision device, comprising:
 a first coil for heating a heater component;
 a PCB arranged adjacent to the first coil, wherein the PCB comprises:
 a first through hole connected to a first end of the first coil; and
 a second through hole connected to a second end of the first coil.

According to a sixth aspect of the present disclosure, there is provided a PCB for an aerosol provision device comprising:
 a first through hole to receive a first end of a first coil; and
 a second through hole to receive a second end of the first coil.

Further features and advantages of the invention will become apparent from the following description of preferred embodiments of the invention, given by way of example only, which is made with reference to the accompanying drawings.

DETAILED DESCRIPTION OF THE DRAWINGS

Figure 1:
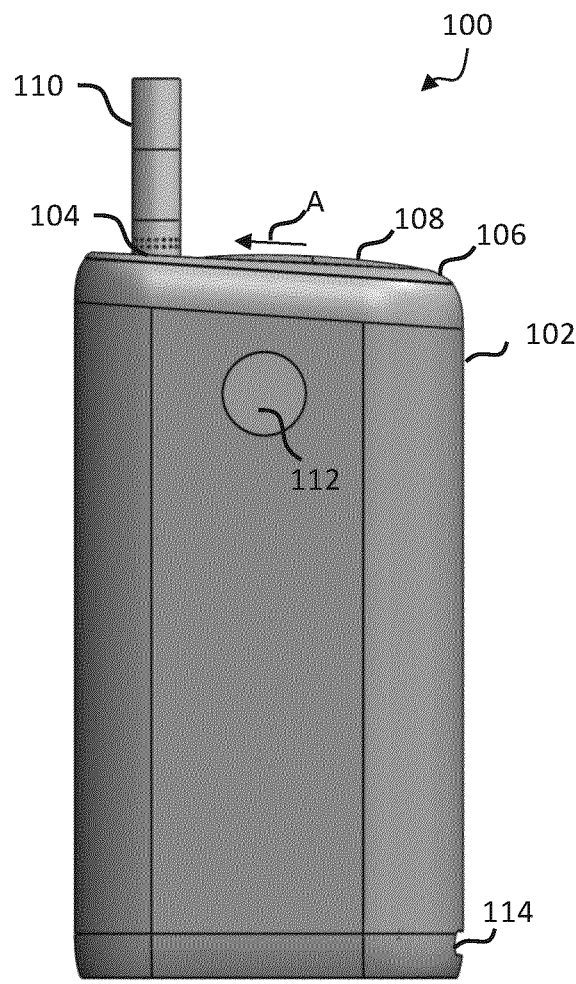
FIG. 1 shows a front view of an example of an aerosol provision device.

As used herein, the term "aerosol generating material" includes materials that provide volatilized components upon heating, typically in the form of an aerosol. Aerosol generating material includes any tobacco-containing material and may, for example, include one or more of tobacco, tobacco derivatives, expanded tobacco, reconstituted tobacco or tobacco substitutes. Aerosol generating material also may include other, non-tobacco, products, which, depending on the product, may or may not contain nicotine. Aerosol generating material may for example be in the form of a solid, a liquid, a gel, a wax or the like. Aerosol generating material may for example also be a combination or a blend of materials. Aerosol generating material may also be known as "smokable material".

Apparatuses are known that heat aerosol generating material to volatilize at least one component of the aerosol generating material, typically to form an aerosol which can be inhaled, without burning or combusting the aerosol generating material. Such an apparatus is sometimes described as an "aerosol generating device," an "aerosol provision device," a "heat-not-burn device," a "tobacco heating product device," or a "tobacco heating device" or similar. Similarly, there are also so-called e-cigarette devices, which typically vaporize an aerosol generating material in the form of a liquid, which may or may not contain nicotine. The aerosol generating material may be in the form of or be provided as part of a rod, cartridge or cassette or the like which can be inserted into the apparatus. A heater for heating and volatilizing the aerosol generating material may be provided as a "permanent" part of the apparatus.

An aerosol provision device can receive an article comprising aerosol generating material for heating. An "article" in this context is a component that includes or contains in use the aerosol generating material, which is heated to volatilize the aerosol generating material, and optionally other components in use. A user may insert the article into the aerosol provision device before it is heated to produce an aerosol, which the user subsequently inhales. The article may be, for example, of a predetermined or specific size that is configured to be placed within a heating chamber of the device which is sized to receive the article.

A first aspect of the present disclosure defines an aerosol provision device comprising an electrical connector, a heater/heating assembly and a printed circuit board (PCB). The PCB comprises a first portion and a second portion, where the first portion is arranged at substantially 90 degrees to the second portion. The first and second portions are electrically connected to each other such that signals, power and/or data can be transmitted between them. The electrical connector, which may be a USB port for example, can be electrically coupled to either the first portion or the second portion of the PCB. The electrical connector may be used to charge a battery of the device, and/or to transfer data between the device and a computing device. The heater assembly may be connected to the other of the first portion and the second portion.

The device therefore has a single PCB with two portions that are arranged perpendicular to each other. The device can therefore be made more compact/smaller because the device need not accommodate a long or large PCB. For example, the length of the device (measured in a direction parallel to the longitudinal axis) can be made shorter because the second portion is arranged perpendicular to the first portion.

In a specific arrangement, the heater assembly is electrically coupled to the first portion and the electrical connector is electrically coupled to the second portion.

In a further arrangement, the heater assembly is electrically coupled to the first portion and the electrical connector is electrically coupled to the second portion and the device comprises a top surface arranged at one end of the device, and a bottom surface arranged at another end of the device, wherein the bottom surface is spaced apart from the top surface along the longitudinal axis. The device may further comprise one or more side surfaces extending between the top and bottom surfaces, extending around the longitudinal axis, and delimiting an opening for access to the electrical connector. Thus, the electrical connector may be arranged at, or near to one of the one or more side surfaces of the device. By having the electrical connector on the side of the device (rather than the bottom, for example), the electrical connector is less prone to water and/or dust ingress. Furthermore, as mentioned above, the device can be made shorter because the electrical connector is arranged on the side of the device, rather than the bottom. The PCB can be made shorter because it does not need to extend all the way to the bottom surface of the device. In addition, because the electrical connector is arranged at the side of the device, the device can remain upright while the electrical connector is accessed (connected to a cable, for example). This can mean that tobacco dust remains in the susceptor.

In an example, the first portion has a first length, and the second portion has a second length, wherein the first length is longer than the second length. The longer portion of the PCB may therefore extend along the longitudinal axis of the device. The first portion may therefore be elongate and define a longitudinal axis that is arranged parallel to the longitudinal axis of the device. The second length may be less than half of the first length, or less than a third of the first length, or less than a quarter of the first length.

The top surface of the device is the end of the device which is arranged closest to the mouth of the user when the device is in use. The bottom surface of the device is the end of the device which is arranged furthest away from the mouth of the user when the device is in use. The top surface/end of the device may be known as the proximal surface/end. The bottom surface/end may be known as the distal surface/end. A first end member may define at least a portion of the top surface. A second end member may define at least a portion of the bottom surface.

The one or more side surfaces are the surfaces of the device which extend around the device. For example, a housing or outer cover of the device may define at least a portion of the one or more side surfaces. In an example, the device comprises a single side surface which extends/curves around the device to provide a continuous side surface. In another example, the device comprises four side surfaces; a front surface, a back surface, a first edge surface and a second edge surface.

The opening which allows the electrical connector to be accessed may be covered by a moveable panel or component. For example, the panel may be opened, such as by a user, a mechanism and/or a motor, when the electrical connector is coupled to a corresponding connector, and closed when the electrical connector is not being used. The panel may therefore further protect from water or dust ingress.

The electrical connector may be located at, or near, the opening to allow the electrical connector to be connected to a corresponding connector.

In a particular example, the electrical connector is a charging port, such as a USB charging port. The corresponding connector may be a cable, for example.

The heating assembly may comprise a susceptor and at least one inductor coil. Ends of the at least one inductor coil may be electrically and mechanically coupled to the first portion of the PCB. For example, ends of the inductor coil may be soldered to the first portion. The device may further comprise a battery that is electrically connected to the first portion. The first portion may be arranged between the heating assembly and battery.

In some examples the first and second portions of the PCB are manufactured as separate components, and are connected via one or more conductive elements, such as one or more wires. However, in another example the first and second portions form part of a single PCB that is manufactured as a single entity. Accordingly, the first and second portions may be rigid, and the PCB may further comprise a flexible portion extending between the first and second portions. The flexible portion comprises an electrically conductive layer such that the second portion is electrically coupled to the first portion. The PCB may therefore be a flexible PCB. The flexible portion may be entirely electrically conductive, or may comprise one or more other flexible layers. By having a single PCB that is flexible, there are fewer connections that may be damaged during the lifetime of the device. For example, the electrically conductive layer does not need to be connected/attached/soldered to the first and second portions, which may act as points of failure.

The electrically conductive layer may extend throughout the first portion and the second portion. For example, the electrically conductive layer may extend along the entire length of the first portion, and may extend along the entire length of the second portion. The electrically conductive layer may therefore be embedded in the first and second portions. The flexible portion (and therefore the conductive layer) may be bent by about 90 degrees with respect to the first portion.

The electrically conductive layer may have a thickness of less than about 0.1 mm. For example, the thickness may be less than about 0.08 mm, such as about 0.07 mm. A conductive layer of copper with a thickness of 0.07 mm corresponds to a thickness of 2 oz. The electrically conductive layer may have a thickness of greater than about 0.05 mm, such as greater than about 0.06 mm. This provides a good balance between reducing the cost of the device (by making the conductive layer thinner) and ensuring the flexible portion is robust enough to avoid being damaged as it is bent (by making the conductive layer thicker).

The flexible portion may comprise thermally insulating layers, and the electrically conductive layer may be arranged between the thermally insulating layers. The thermally insulating layers help insulate the electrically conductive layer from heat generated by the heater assembly. The thermally insulating layers may have a thermal conductivity of less than about 0.5 W/mK. In one example, the thermally insulating layers comprise polyamide.

The electrical connector may be mounted on the second portion. Thus, the electrical connector may be physically connected to the second portion. This can also make the device more compact and less likely to fail because the distance between the electrical connector and the second portion is reduced. Any wires or other connections between the second portion and the electrical connector can therefore be reduced in length. The second portion can also help securely hold the electrical connector as a user couples the electrical connector to a corresponding electrical connector. The electrical connector may define an insertion axis, wherein the insertion axis is perpendicular to the longitudinal axis. The insertion axis can be an axis along which the corresponding electrical connector is inserted.

The device may further comprise a battery support which supports the battery of the device and one or more other components. The first portion of the PCB may be configured to engage the battery support.

The first portion of the PCB may delimit first and second inductor coil through holes, wherein a first end of the inductor coil extends through the first inductor coil through hole, and a second end of the inductor coil extends through the second inductor coil through hole. The inductor coil through holes allow a more secure and robust attachment of the inductor coil to the PCB. For example, if the inductor coil is soldered to the PCB, there is less stress exerted on the solder.

The inductor coil through holes may also be referred to as through holes.

In the second aspect, there is provided a PCB for an aerosol provision device. As mentioned, the PCB comprises a first portion and a second portion, wherein the first portion is configured to be electrically coupled to one of a heater assembly and an electrical connector. The second portion is electrically coupled to the first portion. The second portion may be configured to be electrically coupled to the other of the heater assembly and the electrical connector. The electrical connector may also be mechanically coupled to the first or second portions. For example, the PCB may comprise the electrical connector mounted on the portion. The heater assembly may also be mechanically coupled to the first or second portions.

The first and second portions may be configured to be arranged perpendicular to each other.

The PCB may comprise any, or all of the features described above with reference to the aerosol provision device.

The fifth aspect of the present disclosure defines an aerosol provision device comprising a first coil and a PCB. The PCB comprises a first through hole/aperture to receive a first end of the first coil, and a second through hole/aperture to receive a second end of the first coil. The two ends of the coil therefore extend through the two through holes and are connected to the PCB. The "end" of the coil can refer to the end of the wire which forms the coil, for example. The end of the coil may include a section/length of wire towards the terminal end of the coil.

As briefly mentioned above, it has been found that a PCB with through holes for each end of the coil provides a more stable and robust attachment for the coil. By passing through the through holes, the coil can be more securely connected to the PCB. For example, if the coil is soldered to the PCB, there is less stress exerted on the solder due to the presence of the through holes.

The first through hole may form a mechanical connection to the first end of the first coil, and the second through hole may form a mechanical connection to the second end of the first coil. The through hole may therefore provide stability and support to the first coil.

The first through hole may form both a mechanical and an electrical connection to the first end of the first coil. Similarly, the second through hole may form both a mechanical and an electrical connection to the second end of the first coil. Accordingly, the through hole may not only support the first coil within the device, it may also serve to allow the first coil to be electrically connected to the PCB. The through hole may, for example, be surrounded by a conductive area on a surface of the PCB or expose an electrically conductive layer within the PCB.

In some examples the first coil is helical. The first coil may be a first inductor coil configured to generate a varying magnetic field for heating the heater component. The heater component may be a susceptor, for example.

The first coil may be substantially rigid. For example, the first coil may retain its shape when the first and second ends of the coil are connected to the PCB. In a specific example, forming the first coil comprises winding a litz wire into a helical shape and curing the litz wire. For example, individual wires within the litz wire may comprise a bondable coating. When the bondable coating on the individual wires is cured, via a heating and cooling process for example, the coil can retain its shape.

The first and second through holes may each have an axis which is substantially perpendicular to a first axis defined by the first coil. For example, the through holes may be formed through the PCB in a direction that is perpendicular to an axis of the first coil. The axis may extend from a first surface of the PCB to a second surface of the PCB. The first coil may be helical and may define the first axis around which a wire of the coil is wound. The first axis of the first coil may be parallel to an axis of the susceptor/heater component. In some examples the first axis is coaxial with the longitudinal axis of the heater component. To connect the first coil to the PCB, the first and second ends of the first coil may extend through the first and second through holes in a direction parallel to the axes defined by the first and second through holes.

In some examples, the device further comprises a second coil for heating the heater component. The first coil may be adjacent to the second coil in a direction along a first axis defined by the first coil (or an axis defined by the susceptor/heater component). The PCB may further comprise a third through hole connected to a first end of the second coil and a fourth through hole connected to a second end of the second coil. The first, second, third and fourth through holes may be positioned along a second axis that is parallel to the first axis. The second axis may be parallel to a longitudinal axis of the PCB.

Accordingly, the second coil may also be connected to PCB via two through holes. The third through hole/aperture receives a first end of the second coil, and the fourth through hole/aperture receives a second end of the second coil. The two ends of the second coil therefore extend through the two through holes and are connected to the PCB. As mentioned above, these two through holes allow the second coil to be more securely connected to the PCB. Furthermore, by having the first, second, third and fourth through holes positioned along a second axis that is parallel to the first axis, the device may be easier and more efficient to assemble. In addition, other parts of the PCB may be more easily accessed because the coil connections are arranged uniformly.

The second coil may be a second inductor coil configured to generate a varying magnetic field for heating the heater component.

The second coil may define an axis that is parallel and coaxial with the first axis defined by the first coil.

The first, second, third, and fourth through holes may be arranged towards an edge of the PCB. For example, they may be displaced from the geometric center (or a central longitudinal axis) of the PCB towards one edge/side. This can make it easier for other parts of the PCB to be accessed during assembly of the device.

At least one of the first, second, third, or fourth through holes may be within 5 mm of an edge of the PCB. For example, the circumference/edge of the through holes nearest to the edge of the PCB may be within 5 mm of the edge of the PCB. In one example at least one of the first, second, third, or fourth through holes is within 2 mm of an edge of the PCB. For example, the circumference/edge of the through holes nearest to the edge of the PCB may be within 2 mm of the edge of the PCB. In a particular example the circumference/edge of the through holes nearest to the edge of the PCB is within about 1.5 mm of the edge of the PCB. In a specific example at least one of the first, second, third, or fourth through holes are greater than about 1 mm from the edge of the PCB. This provides a good balance between ensuring that space on the PCB is maximized (by arranging the through holes close to the edge of the PCB), and ensuring that the PCB provides enough stability to the coil without breaking (by ensuring they are positioned far enough away from the edge).

The PCB may have a width/length and at least one of the first, second, third, or fourth through holes may be positioned away from an edge of the PCB by a distance. The ratio of the distance to the width (or length) may be less than about 0.3. The ratio is the distance divided by the width (or length). The ratio of the distance to the width (or length) may be less than about 0.2, or less than about 0.1. Preferably, the ratio of the distance to the width (or length) is less than about 0.06. This provides a good balance between ensuring that space on the PCB is maximized (by arranging the through holes close to the edge of the PCB), and ensuring that the PCB provides enough stability to the coil without breaking (by ensuring they are positioned far enough away from the edge). In a particular example, the width is about 18 mm and the first, second, third and fourth through holes may be positioned away from an edge of the PCB by a distance of less than about 5 mm. The width of the PCB is measured in a direction perpendicular to the longitudinal axis of the PCB. The length of the PCB is measured in a direction parallel to the longitudinal axis of the PCB. The distance is measured in a direction perpendicular to the longitudinal axis of the PCB.

The first, second, third and fourth through holes may have a diameter of less than about 3 mm or less than about 1.5 mm. Preferably the diameter of through holes is less than about 2 mm or less than about 1 mm greater than the diameter of the wires forming the coils to ensure that the attachment is more secure. In one example, the diameter of the wires forming the coils is about 1.3 mm and the diameter of the through holes is about 2.3 mm.

The first end of the first coil may be substantially tangential to the first coil and the first end of the second coil may be substantially tangential to the second coil. The ends of the coils may comprise a section/length of wire towards the terminal end of the coil.

In some examples, the second end of the first coil is not tangential to the first coil, such that the first end of the first coil and the second end of the first coil are arranged along the second axis. Similarly, the second end of the second coil is not tangential to the second coil such that the first end of the second coil and the second end of the second coil are arranged along the second axis. For example, the second ends of the first and second coils may be bent by about 90 degrees relative to a tangent of the coil. This arrangement means that the first and second ends of both coils can lie along the second axis. As mentioned, this can provide easier access to the PCB.

In the sixth aspect, there is provided a printed circuit board, PCB, for an aerosol provision device, wherein the PCB comprises a first through hole to receive a first end of a first coil and a second through hole to receive a second end of the first coil.

The PCB may further comprise a third through hole to receive a first end of a second coil and a fourth through hole to receive a second end of the second coil. The first, second, third and fourth through holes are arranged in a straight line. For example, they may be aligned along an axis.

The PCB may define a longitudinal axis, and wherein the straight line is arranged parallel to the longitudinal axis. The longitudinal axis may be parallel to an edge of the PCB, for example, parallel to the longest edge of a generally rectangular PCB.

The first, second, third and fourth through holes may be less than about 5 mm from an edge of the PCB. In some examples, the first, second, third and fourth through holes may be greater than about 1 mm from the edge of the PCB.

The PCB may comprise any, or all of the features described above in relation to the aerosol provision device.

Preferably, the device is a tobacco heating device, also known as a heat-not-burn device.

As briefly mentioned above, in some examples, the coil(s) is/are configured to, in use, cause heating of at least one electrically-conductive heating component/element (also known as a heater component/element), so that heat energy is conductible from the at least one electrically-conductive heating component to aerosol generating material to thereby cause heating of the aerosol generating material.

In some examples, the coil(s) is/are configured to generate, in use, a varying magnetic field for penetrating at least one heating component/element, to thereby cause induction heating and/or magnetic hysteresis heating of the at least one heating component. In such an arrangement, the heating component may be termed a "susceptor." A coil that is configured to generate, in use, a varying magnetic field for penetrating at least one electrically-conductive heating component, to thereby cause induction heating of the at least one electrically-conductive heating component, may be termed an "induction coil" or "inductor coil."

The device may include the heating component(s), for example electrically-conductive heating component(s), and the heating component(s) may be suitably located or locatable relative to the coil(s) to enable such heating of the heating component(s). The heating component(s) may be in a fixed position relative to the coil(s). Alternatively, the at least one heating component, for example at least one electrically-conductive heating component, may be included in an article for insertion into a heating zone of the device, wherein the article also comprises the aerosol generating material and is removable from the heating zone after use. Alternatively, both the device and such an article may comprise at least one respective heating component, for example at least one electrically-conductive heating component, and the coil(s) may be to cause heating of the heating component(s) of each of the device and the article when the article is in the heating zone.

In some examples, the coil(s) is/are helical. In some examples, the coil(s) encircles at least a part of a heating zone of the device that is configured to receive aerosol generating material. In some examples, the coil(s) is/are helical coil(s) that encircles at least a part of the heating zone. The heating zone may be a receptacle, shaped to receive the aerosol generating material.

In some examples, the device comprises an electrically-conductive heating component that at least partially surrounds the heating zone, and the coil(s) is/are helical coil(s) that encircles at least a part of the electrically-conductive heating component. In some examples, the electrically-conductive heating component is tubular. In some examples, the coil is an inductor coil.

FIG. 1 shows an example of an aerosol provision device 100 for generating aerosol from an aerosol generating medium/material. In broad outline, the device 100 may be used to heat a replaceable article 110 comprising the aerosol generating medium, to generate an aerosol or other inhalable medium which is inhaled by a user of the device 100.

The device 100 comprises a housing 102 (in the form of an outer cover) which surrounds and houses various components of the device 100. The device 100 has an opening 104 in one end, through which the article 110 may be inserted for heating by a heating assembly. In use, the article 110 may be fully or partially inserted into the heating assembly where it may be heated by one or more components of the heater assembly.

The device 100 of this example comprises a first end member 106 which comprises a lid 108 which is moveable relative to the first end member 106 to close the opening 104 when no article 110 is in place. In FIG. 1, the lid 108 is shown in an open configuration, however the cap 108 may move into a closed configuration. For example, a user may cause the lid 108 to slide in the direction of arrow "A".

The device 100 may also include a user-operable control element 112, such as a button or switch, which operates the device 100 when pressed. For example, a user may turn on the device 100 by operating the switch 112.

The device 100 may also comprise an electrical connector/component, such as a socket/port 114, which can receive a cable to charge a battery of the device 100. For example, the socket 114 may be a charging port, such as a USB charging port. In some examples the socket 114 may be used additionally or alternatively to transfer data between the device 100 and another device, such as a computing device.

FIG. 2 depicts the device 100 of FIG. 1 with the outer cover 102 removed and without an article 110 present. The device 100 defines a longitudinal axis 134.

As shown in FIG. 2, the first end member 106 is arranged at one end of the device 100 and a second end member 116 is arranged at an opposite end of the device 100. The first and second end members 106, 116 together at least partially define end surfaces of the device 100. For example, the bottom surface of the second end member 116 at least partially defines a bottom surface of the device 100. Edges of the outer cover 102 may also define a portion of the end surfaces. In this example, the lid 108 also defines a portion of a top surface of the device 100.

The end of the device closest to the opening 104 may be known as the proximal end (or mouth end) of the device 100 because, in use, it is closest to the mouth of the user. In use, a user inserts an article 110 into the opening 104, operates the user control 112 to begin heating the aerosol generating material and draws on the aerosol generated in the device. This causes the aerosol to flow through the device 100 along a flow path towards the proximal end of the device 100.

The other end of the device furthest away from the opening 104 may be known as the distal end of the device 100 because, in use, it is the end furthest away from the mouth of the user. As a user draws on the aerosol generated in the device, the aerosol flows away from the distal end of the device 100.

The device 100 further comprises a power source 118. The power source 118 may be, for example, a battery, such as a rechargeable battery or a non-rechargeable battery. Examples of suitable batteries include, for example, a lithium battery (such as a lithium-ion battery), a nickel battery (such as a nickel-cadmium battery), and an alkaline battery. The battery is electrically coupled to the heating assembly to supply electrical power when required and under control of a controller (not shown) to heat the aerosol generating material. In this example, the battery is connected to a central support 120 which holds the battery 118 in place. The central support 120 may also be known as a battery support, or battery carrier.

The device further comprises at least one electronics module 122. The electronics module 122 may comprise, for example, a printed circuit board (PCB). The PCB 122 may support at least one controller, such as a processor, and memory. The PCB 122 may also comprise one or more electrical tracks to electrically connect together various electronic components of the device 100. For example, the battery terminals may be electrically connected to the PCB 122 so that power can be distributed throughout the device 100. The socket 114 may also be electrically coupled to the battery via the electrical tracks.

In the example device 100, the heating assembly is an inductive heating assembly and comprises various components to heat the aerosol generating material of the article 110 via an inductive heating process. Induction heating is a process of heating an electrically conducting object (such as a susceptor) by electromagnetic induction. An induction heating assembly may comprise an inductive element, for example, one or more inductor coils, and a device for passing a varying electric current, such as an alternating electric current, through the inductive element. The varying electric current in the inductive element produces a varying magnetic field. The varying magnetic field penetrates a susceptor suitably positioned with respect to the inductive element, and generates eddy currents inside the susceptor. The susceptor has electrical resistance to the eddy currents, and hence the flow of the eddy currents against this resistance causes the susceptor to be heated by Joule heating. In cases where the susceptor comprises ferromagnetic material such as iron, nickel or cobalt, heat may also be generated by magnetic hysteresis losses in the susceptor, i.e. by the varying orientation of magnetic dipoles in the magnetic material as a result of their alignment with the varying magnetic field. In inductive heating, as compared to heating by conduction for example, heat is generated inside the susceptor, allowing for rapid heating. Further, there need not be any physical contact between the inductive heater and the susceptor, allowing for enhanced freedom in construction and application.

The induction heating assembly of the example device 100 comprises a susceptor arrangement 132 (herein referred to as "a susceptor"), a first inductor coil 124 and a second inductor coil 126. The first and second inductor coils 124, 126 are made from an electrically conducting material. In this example, the first and second inductor coils 124, 126 are made from litz wire/cable which is wound in a helical fashion to provide helical inductor coils 124, 126. Litz wire comprises a plurality of individual wires which are individually insulated and are twisted together to form a single wire. Litz wires are designed to reduce the skin effect losses in a conductor. In the example device 100, the first and second inductor coils 124, 126 are made from copper litz wire which has a rectangular cross section. In other examples the litz wire can have other shape cross sections, such as circular.

The first inductor coil 124 is configured to generate a first varying magnetic field for heating a first section of the susceptor 132 and the second inductor coil 126 is configured to generate a second varying magnetic field for heating a second section of the susceptor 132. In this example, the first inductor coil 124 is adjacent to the second inductor coil 126 in a direction along the longitudinal axis 134 of the device 100 (that is, the first and second inductor coils 124, 126 to not overlap). The susceptor arrangement 132 may comprise a single susceptor, or two or more separate susceptors. Ends 130 of the first and second inductor coils 124, 126 can be connected to the PCB 122.

Figure 2:
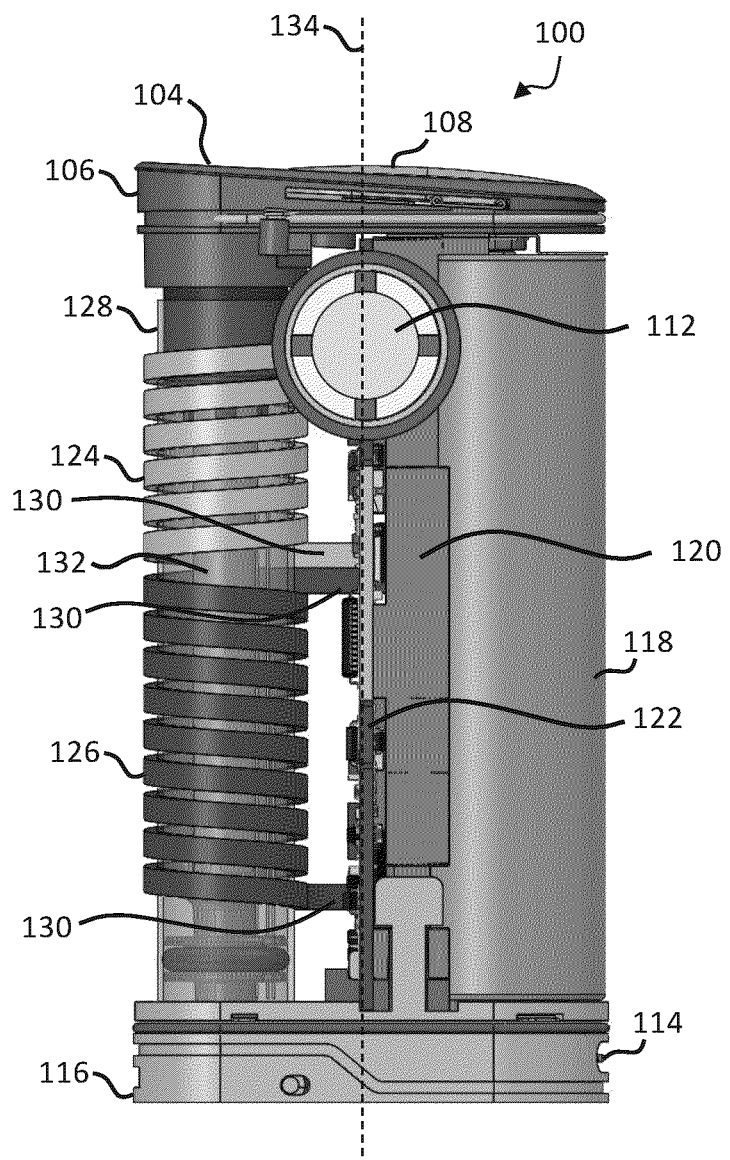
FIG. 2 shows a front view of the aerosol provision device of FIG. 1 with an outer cover removed.

It will be appreciated that the first and second inductor coils 124, 126, in some examples, may have at least one characteristic different from each other. For example, the first inductor coil 124 may have at least one characteristic different from the second inductor coil 126. More specifically, in one example, the first inductor coil 124 may have a different value of inductance than the second inductor coil 126. In FIG. 2, the first and second inductor coils 124, 126 are of different lengths such that the first inductor coil 124 is wound over a smaller section of the susceptor 132 than the second inductor coil 126. Thus, the first inductor coil 124 may comprise a different number of turns than the second inductor coil 126 (assuming that the spacing between individual turns is substantially the same). In yet another example, the first inductor coil 124 may be made from a different material to the second inductor coil 126. In some examples, the first and second inductor coils 124, 126 may be substantially identical.

In this example, the first inductor coil 124 and the second inductor coil 126 are wound in opposite directions. This can be useful when the inductor coils are active at different times. For example, initially, the first inductor coil 124 may be operating to heat a first section of the article 110, and at a later time, the second inductor coil 126 may be operating to heat a second section of the article 110. Winding the coils in opposite directions helps reduce the current induced in the inactive coil when used in conjunction with a particular type of control circuit. In FIG. 2, the first inductor coil 124 is a right-hand helix and the second inductor coil 126 is a left-hand helix. However, in another embodiment, the inductor coils 124, 126 may be wound in the same direction, or the first inductor coil 124 may be a left-hand helix and the second inductor coil 126 may be a right-hand helix.

The susceptor 132 of this example is hollow and therefore defines a receptacle within which aerosol generating material is received. For example, the article 110 can be inserted into the susceptor 132. In this example the susceptor 120 is tubular, with a circular cross section.

The device 100 of FIG. 2 further comprises an insulating member 128 which may be generally tubular and at least partially surround the susceptor 132. The insulating member 128 may be constructed from any insulating material, such as plastic for example. In this particular example, the insulating member is constructed from polyether ether ketone (PEEK). The insulating member 128 may help insulate the various components of the device 100 from the heat generated in the susceptor 132.

The insulating member 128 can also fully or partially support the first and second inductor coils 124, 126. For example, as shown in FIG. 2, the first and second inductor coils 124, 126 are positioned around the insulating member 128 and are in contact with a radially outward surface of the insulating member 128. In some examples the insulating member 128 does not abut the first and second inductor coils 124, 126. For example, a small gap may be present between the outer surface of the insulating member 128 and the inner surface of the first and second inductor coils 124, 126.

In a specific example, the susceptor 132, the insulating member 128, and the first and second inductor coils 124, 126 are coaxial around a central longitudinal axis of the susceptor 132.

Figure 3:
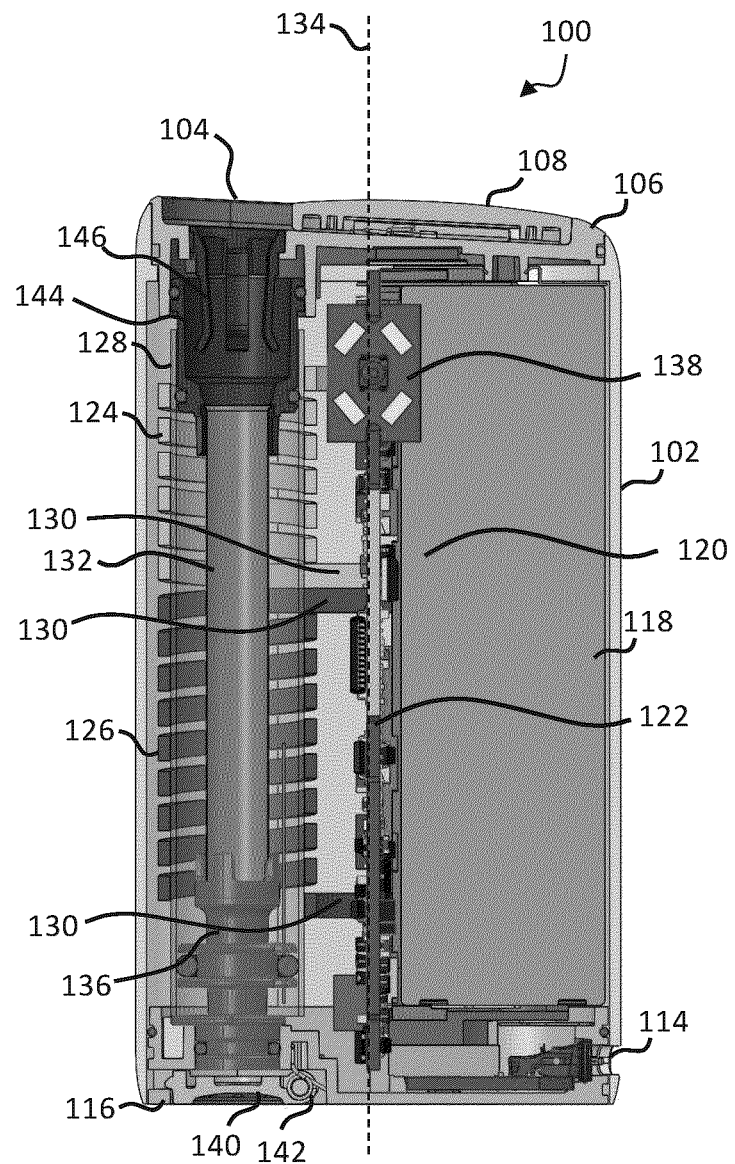
FIG. 3 shows a cross-sectional view of the aerosol provision device of FIG. 1.

FIG. 3 shows a side view of device 100 in partial cross-section. The outer cover 102 is present in this example. The rectangular cross-sectional shape of the first and second inductor coils 124, 126 is more clearly visible.

The device 100 further comprises a support 136 which engages one end of the susceptor 132 to hold the susceptor 132 in place. The support 136 is connected to the second end member 116.

The device may also comprise a second printed circuit board 138 associated within the control element 112.

The device 100 further comprises a second lid/cap 140 and a spring 142, arranged towards the distal end of the device 100. The spring 142 allows the second lid 140 to be opened, to provide access to the susceptor 132. A user may open the second lid 140 to clean the susceptor 132 and/or the support 136.

The device 100 further comprises an expansion chamber 144 which extends away from a proximal end of the susceptor 132 towards the opening 104 of the device. Located at least partially within the expansion chamber 144 is a retention clip 146 to abut and hold the article 110 when received within the device 100. The expansion chamber 144 is connected to the end member 106.

Figure 4:
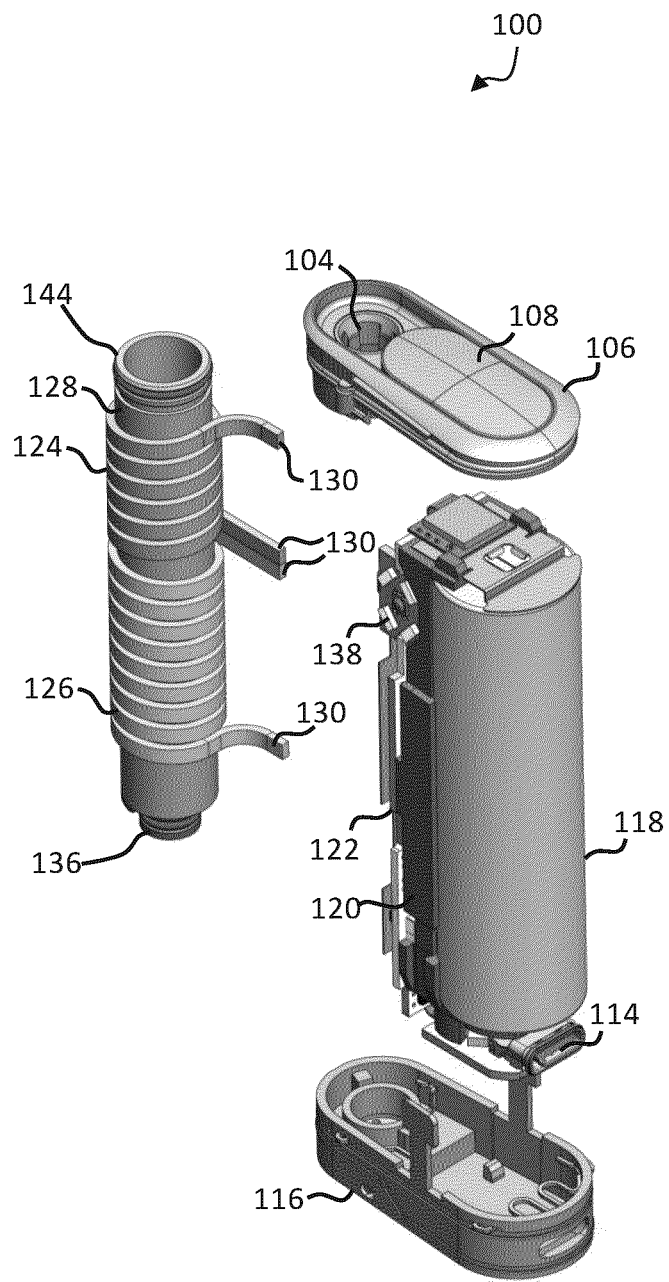
FIG. 4 shows an exploded view of the aerosol provision device of FIG. 2.

FIG. 4 is an exploded view of the device 100 of FIG. 1, with the outer cover 102 omitted.

Figures 5A, 5B:
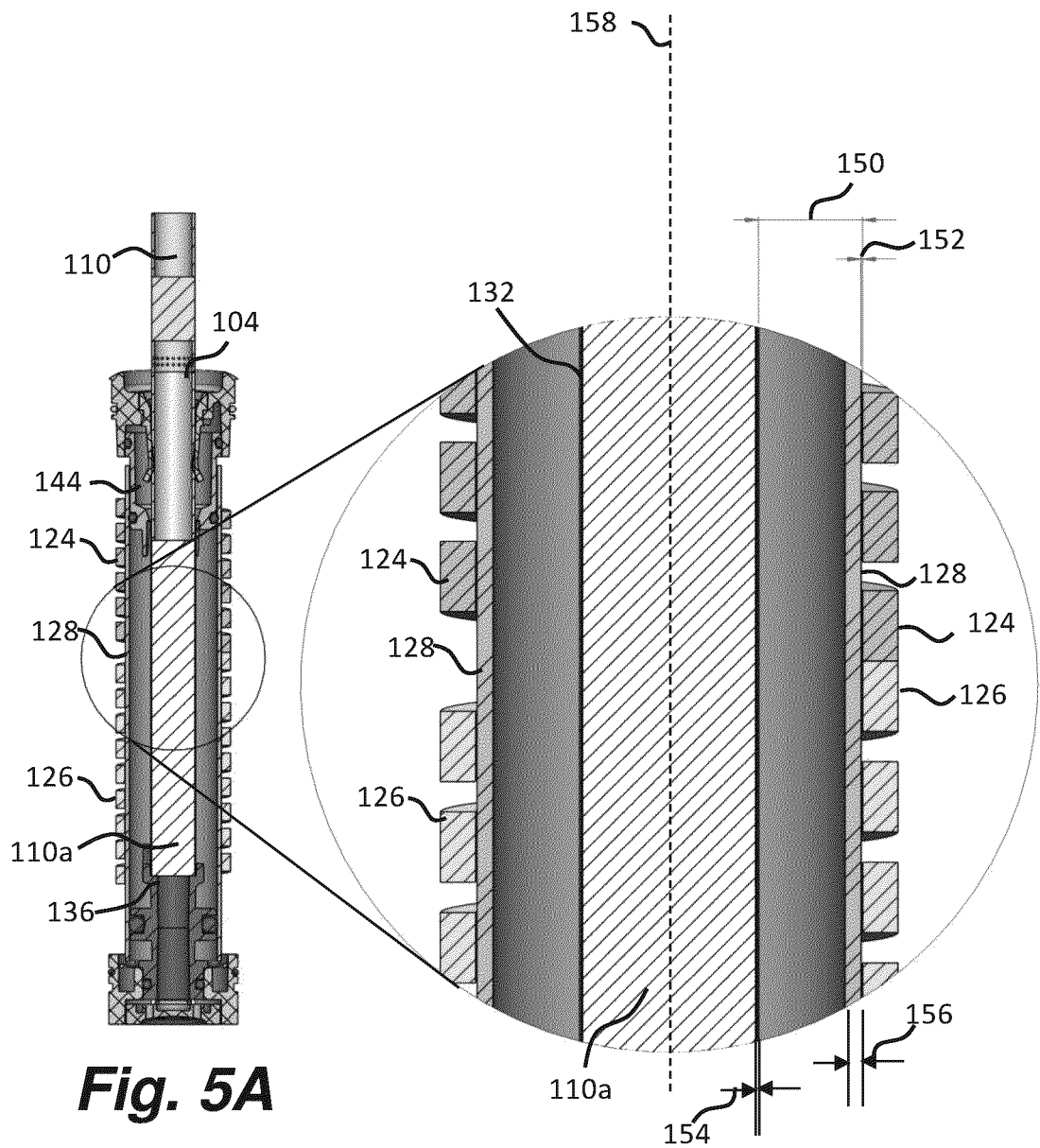
FIG. 5A shows a cross-sectional view of a heating assembly within an aerosol provision device.
FIG. 5B shows a close-up view of a portion of the heating assembly of FIG. 5A.

FIG. 5A depicts a cross section of a portion of the device 100 of FIG. 1. FIG. 5B depicts a close-up of a region of FIG. 5A. FIGS. 5A and 5B show the article 110 received within the susceptor 132, where the article 110 is dimensioned so that the outer surface of the article 110 abuts the inner surface of the susceptor 132. This ensures that the heating is most efficient. The article 110 of this example comprises aerosol generating material 110a. The aerosol generating material 110a is positioned within the susceptor 132. The article 110 may also comprise other components such as a filter, wrapping materials and/or a cooling structure.

FIG. 5B shows that the outer surface of the susceptor 132 is spaced apart from the inner surface of the inductor coils 124, 126 by a distance 150, measured in a direction perpendicular to a longitudinal axis 158 of the susceptor 132. In one particular example, the distance 150 is about 3 mm to 4 mm, about 3 mm to 3.5 mm, or about 3.25 mm.

FIG. 5B further shows that the outer surface of the insulating member 128 is spaced apart from the inner surface of the inductor coils 124, 126 by a distance 152, measured in a direction perpendicular to a longitudinal axis 158 of the susceptor 132. In one particular example, the distance 152 is about 0.05 mm. In another example, the distance 152 is substantially 0 mm, such that the inductor coils 124, 126 abut and touch the insulating member 128.

In one example, the susceptor 132 has a wall thickness 154 of about 0.025 mm to 1 mm, or about 0.05 mm.

In one example, the susceptor 132 has a length of about 40 mm to 60 mm, about 40 mm to 45 mm, or about 44.5 mm.

In one example, the insulating member 128 has a wall thickness 156 of about 0.25 mm to 2 mm, about 0.25 mm to 1 mm, or about 0.5 mm.

Figure 6:
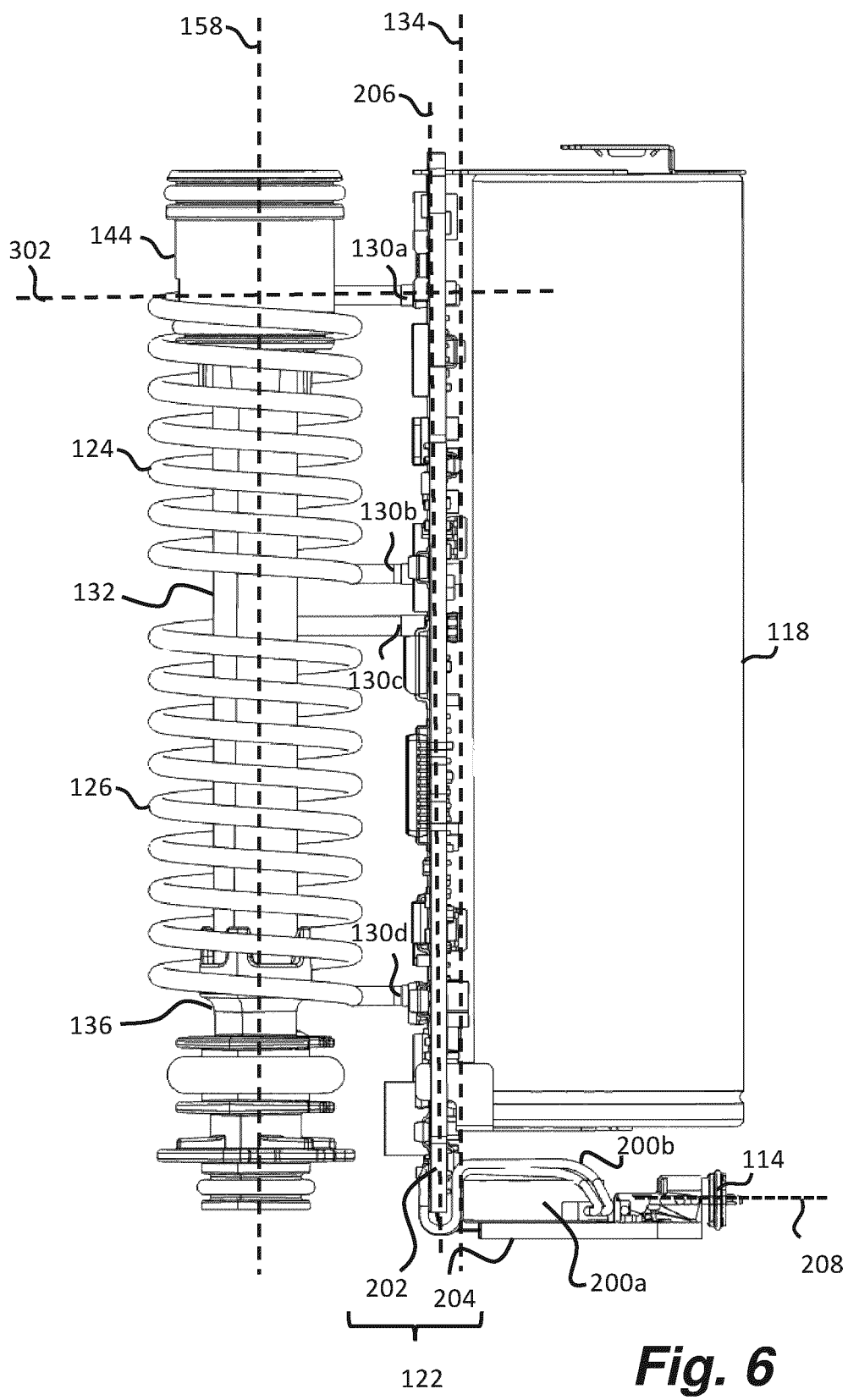
FIG. 6 shows a portion of the device.

FIG. 6 depicts a portion of the device 100. In this example the first and second inductor coils are shown comprising litz wire with a circular cross section, rather than a rectangular cross section. In other examples the litz wire may have a rectangular, or other shaped cross section.

As briefly mentioned above, the device comprises an electrical connector 114. In this example the electrical connector is a female USB-C port, other forms of USB port may be used in other examples, along with other ports such as sockets for coaxial power connecters. The electrical connector 114 can be accessed via an opening/aperture formed in the outer cover 102 (see FIG. 1). Specifically, the device 100 comprises a continuous side surface (defined by the outer cover 102) which extends around the device and longitudinal axis 134 in an azimuthal direction. The opening to the electrical connector 114 is formed in this side surface. The device 100 also comprises a top/upper surface, which is at least partially defined by the first end member 106. The top surface is therefore the surface which is closest to the mouth of the user when the device is in use. The device 100 also comprises a bottom/lower surface, which is at least partially defined by the second end member 116. The bottom surface is therefore the surface which is furthest away from the mouth of the user when the device is in use. The continuous side surface therefore extends between the top and bottom surfaces. By arranging the electrical connector 114 in the side of the device 100, water and dust is less likely to enter into the electrical connector 114.

A user can connect a corresponding electrical connector (such as a male USB connector) with the electrical connector 114 by moving the corresponding electrical connector along an insertion axis 208 towards to the electrical connector 114. The insertion axis 208 is arranged perpendicular to the longitudinal axis 206 of a first portion 202 of the PCB 122 and the longitudinal axis 134 of the device 100.

FIG. 6 also shows the heater/heating assembly of the device 100. In this example the heater assembly comprises the first and second inductor coils 124, 126 which helically extend around the susceptor 132. The susceptor 132 is supported at each end by the support 136 and the expansion chamber 144. The first and second inductor coils 124, 126 may be replaced by a single inductor coil, or three or more inductor coils in certain examples. The heater assembly may alternatively be a resistive heating assembly, in some examples.

The first inductor coil 124 defines a first axis that is coaxial with the longitudinal axis 158 of the susceptor. The second inductor coil 126 defines a second axis that is coaxial with the longitudinal axis 158 of the susceptor. The first inductor coil 124 is wound helically around the first axis and the second inductor coil 126 is wound helically around the second axis.

Arranged between the battery 118 and the heating assembly is a first portion 202 of the PCB 122. Arranged below the battery 118 is a second portion 204 of the PCB 122. Mounted on the first portion 202 of the PCB 122 are a variety of electrical components, such as memory and a controller. As will be described in more detail below, ends 130a, 130b, 130c, 130d of the one or more inductor coils 124, 126 can be connected to the PCB 122, such as the first portion 202 of the PCB 122. The electrical connector 114 is electrically coupled to the second portion 204 of the PCB 122. In this example, the electrical connector 114 is physically mounted upon the second portion 204. As will be explained in more detail, the second portion 204 is electrically coupled to the first portion 202. Data and/or signals can be transmitted between the first and second portions 202, 204. In some examples, the second portion 204 is omitted, such that the PCB 122 is defined only by the first portion 202.

FIG. 6 also shows a haptic motor 200a mounted in the second portion 204. One or more cables 200b can connect the haptic motor 200a to the first portion 202.

As shown, the first portion 202 is arranged parallel to the longitudinal axis 134 of the device 100 and/or the longitudinal axis 158 of the susceptor 132. The first portion 202 therefore defines a longitudinal axis 206 which is arranged parallel to the longitudinal axis 134 of the device 100 and/or the longitudinal axis 158 of the susceptor 132. The longitudinal axis 206 of the first portion 202 is defined by the longest dimension (length) of the first portion 202. In FIG. 6, the longest edges of the first portion 202 extend along the longitudinal axis 206.

The battery support 120 (shown in FIGS. 2 and 4) is omitted from FIG. 6 for clarity. In some examples the PCB 122 is engaged with the battery support 120. The heater assembly is positioned on one side of the first portion 202, and the battery support 120 and the battery 118 are positioned on the other side of the first portion 202.

Figure 7:
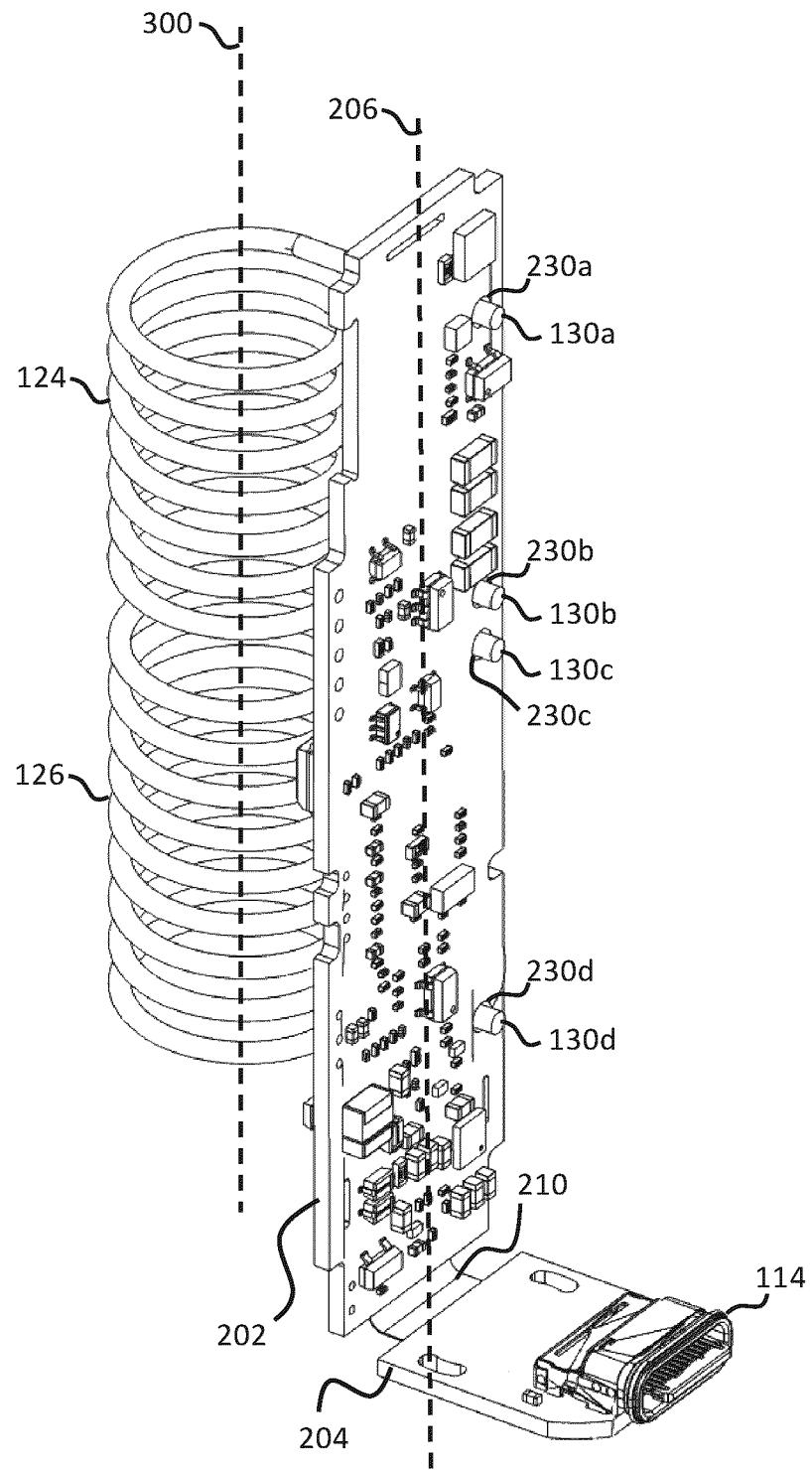
FIG. 7 shows a perspective view of a PCB and heater assembly.

FIG. 7 depicts a perspective view of the PCB 122 and heating assembly. As shown, the first portion 202 of the PCB 122 is electrically coupled to the second portion 204 of the PCB 122 by a flexible portion 210. The flexible portion 210 extends between the first and second portions 202, 204 and is bent by about 90 degrees. Data and/or electrical signals can be transferred between the first and second portions 202, 204 via the flexible portion 210. The flexible portion 210 allows the second portion 204 to be orientated at 90 degrees with respect to the first portion 202. The second portion 204 is therefore arranged perpendicular to the longitudinal axis 206 of the first portion 202. By arranging the second portion 204 in this way, the overall length of the device 100 (measured along the longitudinal axis 134 of the device 100) can be reduced and the electrical connector 114 can be arranged on the side of the device 100.

FIG. 7 more clearly depicts the ends 130a, 130b, 130c, 130d of the first and second inductor coils 124, 126 being connected to the first portion 202 of the PCB 122. In this example, the first portion 202 delimits first and second inductor coil through holes 230a, 230b, where a first end 130a of the first inductor coil 124 extends through the first inductor coil through hole 230a, and a second end 130b of the first inductor coil 124 extends through the second inductor coil through hole 230b. The first portion 202 can also delimit third and fourth inductor coil through holes 230c, 230d, and a first end 130c of the second inductor coil 126 may extend through the third inductor coil through hole 230c, and a second end 130d of the second inductor coil 126 may extend through the fourth inductor coil through hole 230d. The inductor coil through holes 230a, 230b, 230c, 230d allow the heating assembly to be more securely attached to the PCB 122.

The first, second, third, and fourth through holes 230a, 230b, 230c, 230d each define an axis which is substantially perpendicular to a first axis 300 (shown in FIG. 7) defined by the first inductor coil. FIG. 6 shows an axis 302 defined by the first through hole 230a which is perpendicular to the first axis 300, the longitudinal axis 206 of the first portion 202 and the longitudinal axis of the susceptor 158. The second, third, and fourth through holes 230b, 230c, 230d each have a similarly orientated axis. In this example, the first axis 300 of the first inductor coil 124 is parallel to, and coaxial to, the axis 158 of the susceptor/heater component.

As shown in FIG. 7, the ends 130a, 130b, 130c, 130d of the first and second inductor coils 124, 126 extend through the through holes 230a, 230b, 230c, 230d so that the inductor coils 124, 126 are mechanically connected to the PCB 122 (i.e. the first portion 202 of the PCB 122). In this example, the connections also allow the inductor coils 124, 126 to be electrically connected to the PCB 122 to receive a current for inducing a magnetic field in the susceptor 132. For example, the ends of the inductor coils can be soldered in place to provide a mechanical and electrical connection.

Figure 8:
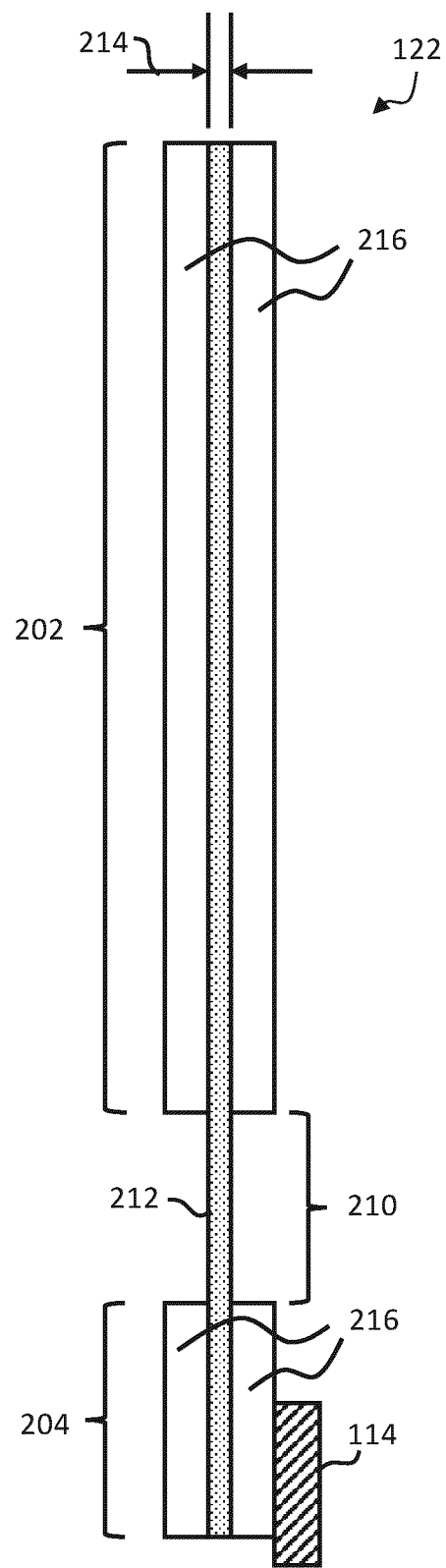
FIG. 8 shows a diagrammatic representation of a PCB.

FIG. 8 is a diagrammatic representation of a cross section through the PCB 122. As mentioned, the PCB 122 has a first portion 202, a second portion 204, and a flexible portion 210 extending between the first and second portions 202, 204.

The flexible portion 210 comprises at least one electrically conductive layer 212 which extends into the first and second portions 202, 204. As shown in FIG. 8, the electrically conductive layer 212 extends completely through the first and second portions 202, 204. Signals and/or data can be transmitted via the conductive layer 212. In other examples the electrically conductive layer 212 terminates before it reaches the ends of the first and second portions 202, 204.

In this example the electrically conductive layer 212 comprises copper. The electrically conductive layer 212 has a thickness 214. In this example the thickness 214 is about 0.07 mm.

In some examples, the flexible portion 210 further comprises two or more other flexible layers, and the electrically conductive layer 212 is arranged between these two or more other layers. For example, the flexible portion 210 may comprise two thermally insulating layers to insulate the conductive layer 212 from heat generated by the heater assembly. The flexible portion 210 may additionally or alternatively comprise two electrically insulating layers to stop the conductive layer 212 from shorting within the device. The thermally insulating layers may also be electrically insulating. In one example the thermally insulating layers comprise polyamide. These additional layers may only be present in the flexible portion 210. Alternatively, these additional layers may extend into the first and second portions 202, 204 but may not extend fully through the first and second portions 202, 204.

The first and second portions 202, 204 each comprise at least one electrically conductive layer 212 arranged between two non-conductive substrate layers 216. The outer non-conductive substrate layers 216 give the first and second portions 202, 204 their rigidity.

Figure 9:
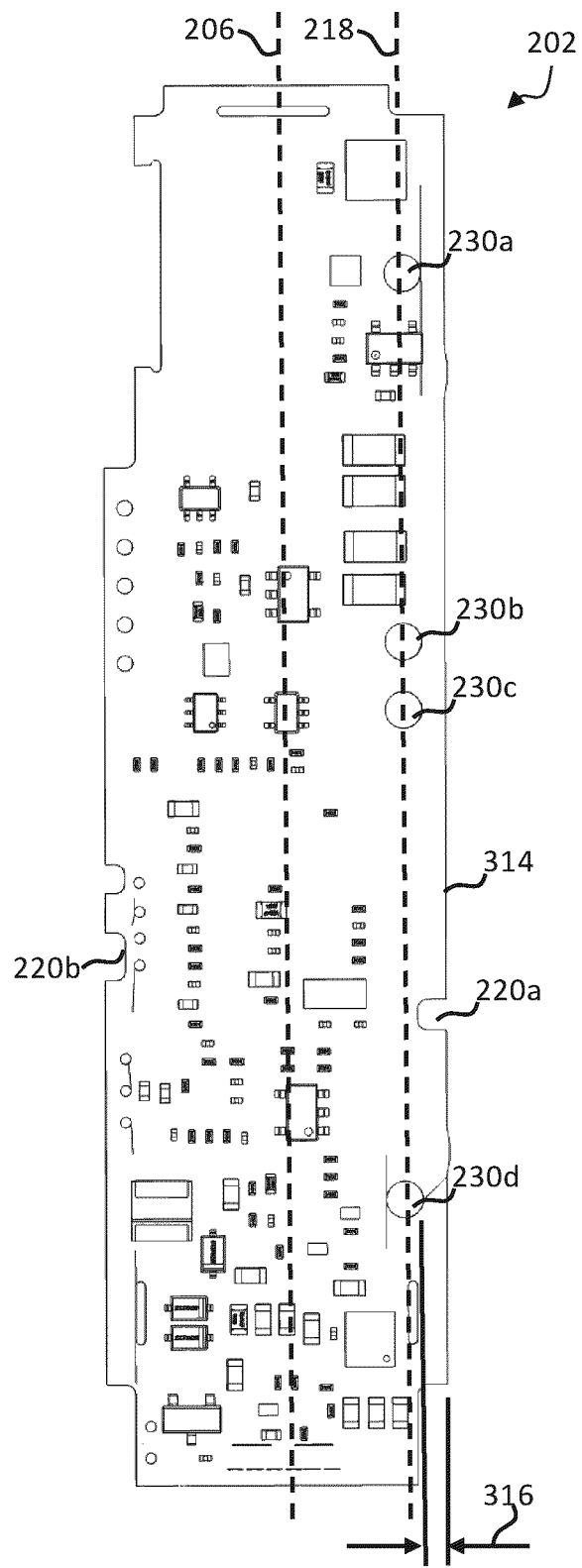
FIG. 9 depicts a first portion of a PCB.

FIG. 9 depicts the first portion 202 of the PCB 122 in more detail. The inductor coil through holes 230a, 230b, 230c, 230d are shown positioned along an axis 218 that is parallel to the longitudinal axis 206 of the first portion 202. This makes it easier to assemble the device. The axis 218 may be positioned towards an edge 314 of the PCB 122 so that the remaining portion of the PCB 122 can still be accessed. The PCB 122 (i.e. the first portion 202) has a generally rectangular shape, and the edge 314 is the longest edge of the PCB 122. The distance 316 between the edges of the through holes 230a, 230b, 230c, 230d and the edge 314 of the PCB 122 is about 1.1 mm in this example. Preferably this distance 316 is less than 5 mm and greater than 1 mm. The edges of the through holes 230a, 230b, 230c, 230d are the edges closest to edge 314 of the PCB 122.

The first portion 202 PCB 122 may also comprise a first notch 220a and a second notch 220b. The first notch 220a is arranged on one side of the first portion 202 and the second notch 220b is arranged on the opposite side. Each notch can receive a corresponding protrusion which extends from the battery support 120. The notches engage the protrusions to better secure the PCB 122 to the battery support 120.

Figure 10:
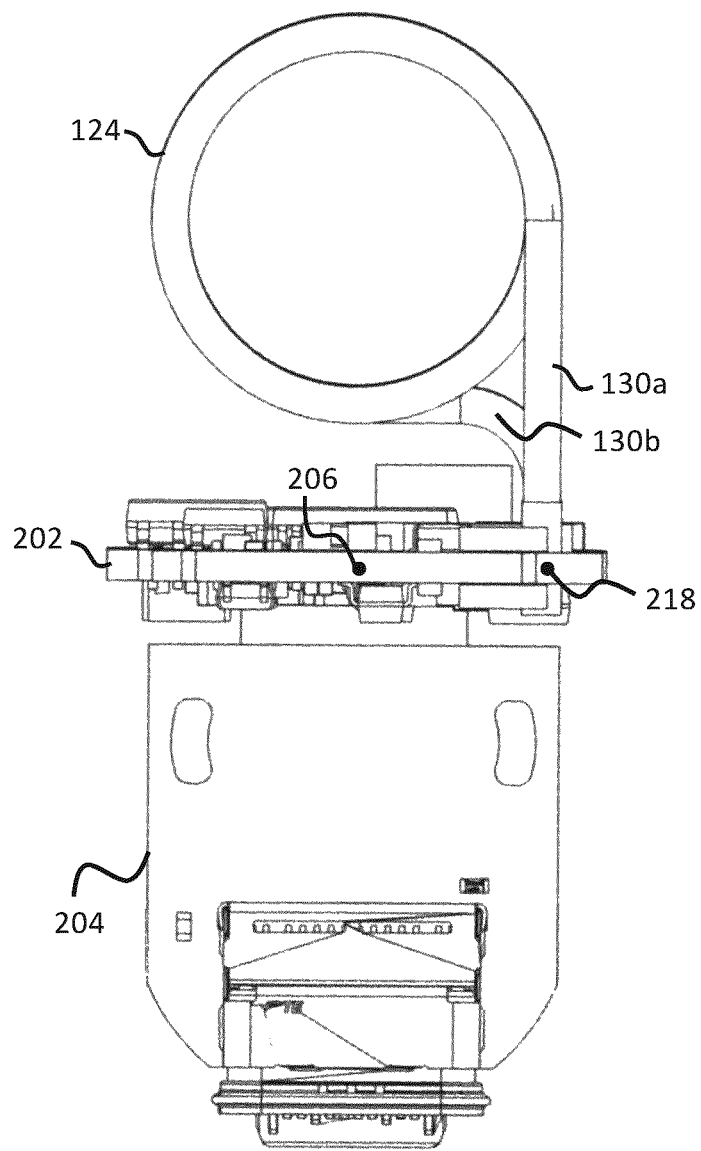
FIG. 10 shows a top-down view of the arrangement of FIG. 7.

FIG. 10 shows a top-down view of the arrangement of FIG. 7. Here the first inductor coil 124 is shown. The second inductor coil 126 is arranged below the first inductor coil 124 and can have a similar shape/form to the first inductor coil 124.

As shown in FIG. 10, the first end 130a of the first inductor coil 124 is arranged substantially tangential to the first inductor coil 124. That is, the first end 130a is tangential to the helical portion of the first inductor coil 124. In contrast, the second end 130b of the first inductor coil 124 is not tangential to the first inductor coil 124. Instead, the second end 130b is bent by about 90 degrees such that the first end 130a of the first inductor coil 124 and the second end 130b of the first inductor coil 124 are arranged along the axis 218 (shown more clearly in FIG. 9). In FIG. 10, the axis 218 extends into the page. The axis 218 is parallel to the longitudinal axis 206 of the first portion 202 of the PCB 122 in this example. The axis 218 passes through the center of the first and second ends 130a, 130b of the first inductor coil 124 at the point where they pass through the first and second through holes 230a, 230b.

Similarly, the first end 130b of the second inductor coil 126 is arranged substantially tangential to the second inductor coil 124. That is, the first end 130c is tangential to the helical portion of the second inductor coil 126. In contrast, the second end 130d of the second inductor coil 126 is not tangential to the second inductor coil 126. Instead, the second end 130d is bent by about 90 degrees such that the first end 130c of the second inductor coil 126 and the second end 130d of the second inductor coil 126 are arranged along the axis 218. The axis 218 therefore also passes through the center of the first and second ends 130c, 130d of the second inductor coil 126 at the point where they pass through the third and fourth through holes 230c, 230d. The first, second, third, and fourth through holes 230a, 230b, 230c, 230d are therefore arranged in a straight line along the axis 218.

The above embodiments are to be understood as illustrative examples of the invention. Further embodiments of the invention are envisaged. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. An aerosol provision device defining a longitudinal axis, and comprising:
   an electrical connector;
   a heater assembly configured to heat aerosol generating material received within the device;
   a printed circuit board (PCB) comprising:
      a first portion arranged substantially parallel to the longitudinal axis; and
      a second portion arranged substantially perpendicular to the longitudinal axis;
      wherein:
         the heater assembly is electrically coupled to one of the first portion and the second portion;
         the second portion is electrically coupled to the first portion; and
         the electrical connector is electrically coupled to the other of the first portion and the second portion.

2. An aerosol provision device according to claim 1, wherein the heater assembly is electrically coupled to the first portion and the electrical connector is electrically coupled to the second portion, and wherein the device comprises:
   a top surface arranged at one end of the device;
   a bottom surface arranged at another end of the device, wherein the bottom surface is spaced apart from the top surface along the longitudinal axis; and
   one or more side surfaces extending between the top and bottom surfaces, extending around the longitudinal axis, and delimiting an opening for access to the electrical connector.

3. An aerosol provision device according to claim 1, wherein:
   the first and second portions are rigid;
   the PCB further comprises a flexible portion extending between the first and second portions; and
   the flexible portion comprises an electrically conductive layer such that the second portion is electrically coupled to the first portion.

4. An aerosol provision device according to claim 3, wherein the electrically conductive layer has a thickness of less than about 0.1 mm.

5. An aerosol provision device according to claim 3, wherein the electrically conductive layer is arranged between thermally insulating layers.

6. An aerosol provision device according to claim 1, wherein the electrical connector is mounted on the second portion.

7. An aerosol provision device according to claim 1, wherein the electrical connector defines an insertion axis, wherein the insertion axis is perpendicular to the longitudinal axis.

8. A printed circuit board (PCB) for an aerosol provision device comprising:
   a first portion arranged substantially parallel along an axis; and
   a second portion arranged substantially perpendicular to the axis;
   wherein:
      the first portion is configured to be electrically coupled to one of a heater assembly and an electrical connector;
      the second portion is electrically coupled to the first portion; and
      the second portion is configured to be electrically coupled to the other of the heater assembly and the electrical connector.

9. A PCB according to claim 8, wherein:
   the first and second portions are rigid;
   the PCB further comprises a flexible portion extending between the first and second portions; and
   the flexible portion comprises an electrically conductive layer such that the second portion is electrically coupled to the first portion.

10. A PCB according to claim 9, wherein the electrically conductive layer has a thickness of less than 0.1 mm.

11. A PCB according to claim 9, wherein the electrically conductive layer is arranged between thermally insulating layers.

12. A PCB according to claim 8, wherein the PCB comprises the electrical connector mounted on the second portion.

13. An aerosol provision system, comprising:
   an electrical connector;
   a heater assembly configured to heat aerosol generating material received within the device;
   a printed circuit board, comprising:
      a first portion arranged substantially parallel to the longitudinal axis, and
      a second portion arranged substantially perpendicular to the longitudinal axis,
      wherein the heater assembly is electrically coupled to one of the first portion and the second portion, the second portion is electrically coupled to the first portion, and the electrical connector is electrically coupled to the other of the first portion and the second portion; and
   an article comprising aerosol generating material.

14. An aerosol provision device according to claim 1, wherein the device is configured to receive an article comprising aerosol generating material.

* * * * *